US005499445A

United States Patent [19]
Boyle et al.

[11] Patent Number: 5,499,445
[45] Date of Patent: Mar. 19, 1996

[54] METHOD OF MAKING A MULTI-LAYER TO PACKAGE

[75] Inventors: Steven R. Boyle, Santa Clara; Robert J. Proebsting, Los Altos Hills; William H. Herndon, Sunnyvale, all of Calif.

[73] Assignee: Intergraph Corporation, Huntsville, Ala.

[21] Appl. No.: 226,920

[22] Filed: Apr. 13, 1994

Related U.S. Application Data

[62] Division of Ser. No. 36,564, Mar. 24, 1993.

[51] Int. Cl.⁶ .......................................... H05K 3/36
[52] U.S. Cl. .................. 29/830; 29/852; 174/35 R; 257/692; 257/700
[58] Field of Search ...................... 257/692, 700; 174/35 R; 29/830, 852

[56] References Cited

U.S. PATENT DOCUMENTS

| | | |
|---|---|---|
| 4,513,355 | 4/1985 | Schroeder et al. . |
| 4,626,889 | 12/1986 | Yamamoto et al. . |
| 4,725,878 | 2/1988 | Miyauchi et al. . |
| 4,751,482 | 6/1988 | Fukuta et al. . |
| 4,811,082 | 3/1989 | Jacobs et al. . |
| 4,827,327 | 5/1989 | Miyauchi et al. . |
| 4,875,087 | 10/1989 | Miyauchi et al. . |
| 4,879,588 | 11/1989 | Ohtsuka et al. . |
| 4,881,116 | 11/1989 | Hidada et al. . |
| 4,890,155 | 12/1989 | Miyagawa et al. . |
| 5,225,709 | 7/1993 | Nishiuma et al. . |
| 5,235,208 | 8/1993 | Katoh . |

FOREIGN PATENT DOCUMENTS

| | | |
|---|---|---|
| 0198698A3 | 10/1986 | European Pat. Off. . |
| 0331289A2 | 9/1989 | European Pat. Off. . |
| 0436848A2 | 7/1991 | European Pat. Off. . |
| WO84/01470 | 4/1984 | WIPO . |

OTHER PUBLICATIONS

*High Frequency Performance of TAB*, Dennis Herrell and David Carey, IEEE Transactions on Components, Hybrids, and Manufacturing Technology, vol. CHMT–10, No. 2 (Jun. 1987).

Kyocera Technical Bulletin: Multilayer Ceramics Design Guidelines (1992).

Kyocera Technical Bulletin: Design Guidelines Multilayer Ceramics (1988).

*Primary Examiner*—Carl J. Arbes
*Attorney, Agent, or Firm*—Townsend and Townsend and Crew

[57] ABSTRACT

A multi-layered package is disclosed that employs novel shielding techniques to improve high frequency performance of the package. Shield vias are placed near conductive vias to create a two-wire transmission line with controllable characteristic impedance. Controlled transmission line impedance reduces signal reflection due to line impedance variations and ground bounce due to inductive coupling. Opposite polarity shielding technique is introduced in vertical as well as horizontal directions to reduce capacitive coupling of noise between signals and provide immunity against differential power supply noise. Signal layers disposed half way between floating shield planes provided immunity against non-common mode noise coupling. For integrated circuits with varying types of signals (e.g. CMOS and TTL and ECL type signals), the package creates electrically isolated zones to drastically reduce noise coupling between the circuits with different signal types.

6 Claims, 7 Drawing Sheets

METHOD OF MAKING A MULTI-LAYER TO PACKAGE

This is a division of application Ser. No. 08/036,564 filed Mar. 24, 1993.

BACKGROUND OF THE INVENTION

The present invention relates generally to design and fabrication of packages for semiconductor devices. More particularly, the present invention relates to multi-layer type packages with controlled impedances and noise for signal paths and reduced inductance for power lines in order to reduce high frequency signal degradation within the package.

In the field of semiconductor device manufacture, it is necessary to provide a connection from an integrated circuit to the "outside world." This function is typically performed by a semiconductor package which houses the integrated circuit (IC) chip and includes a number of leads or pins for electrical signal and power transmission. In addition to transferring signals, power, and the like to and from the outside world, the package serves to protect the integrated circuit from environmental effects and facilitate heat dissipation.

As the operating frequencies of IC's have increased, packaging of IC's has become more critical. With increased switching speed and rate of current change, the transient voltages and consequently inductive impedance in signal paths also increases. A signal transmission path thorough a package typically includes adjacent pins or leads, and parallel vertical vias and adjacent horizontal conductive strips in the case of multi-layer packages or long parallel conductive traces formed by lead frame fingers in the case of dual in-line packages. These structures all exhibit substantial inductance, capacitance and varying impedances that result in signal degradation.

Inductance, particularly in the power and ground connections, causes waveform degradation, ground bounce and cross-talk between the various signals. Capacitive coupling between adjacent signal transmission lines also causes cross-talk which is a source of noise. Variations in signal line impedance cause signal reflections which also cause signal degradation.

The severity of these noise problems is magnified in an environment where low-voltage-swing signals, such as emitter coupled logic (ECL) signals, must operate in the presence of high-voltage-swing signals (e.g. CMOS signals), especially at higher frequencies. From the stand point of power consumption, it is desirable to employ low-voltage-swing signals whenever possible for any signal switching at high frequency. This is due to the fact that physical dimensions force the characteristic impedance of a transmission line to be no higher than about 50 ohms. To eliminate signal reflection, a 50 ohm transmission lines is terminated by a 50 ohm termination resistor. The current through the transmission line is virtually constant regardless of frequency. Therefore, power in watts defined as voltage times current ($P = V \times I$) or voltage squared divided by resistance ($P = V^2/R$), increases directly as the square of signal voltage for a given impedance.

In the case of high-voltage-swing signals, the power required to drive a transmission line with an effective capacitive loading of C is equal to charge $Q$ (or $C \times V$) $\times V \times f$, or $C \times V^2 \times f$. Therefore, more power is consumed to drive a higher frequency signal line. As a result, low-voltage-swing signals are much preferred at higher frequencies to maintain lower power consumption. At the same time, other signals may be required to drive circuits which require high voltage swing.

However, while low-voltage-swing signals inherently generate low noise, they are very susceptible to noise. Conversely, high-voltage-swing signals create more noise during switching, but because of their larger value are more tolerant of noise. Therefore, when the two types of signal are combined in the same environment, noise performance becomes crucial.

Prior art packages have addressed some of these problems to some extent. However, there remains a need for multi-layer packages that satisfactorily address the above problems without requiring non-standard fabrication mechanisms.

It is therefore desirable to provide a multi-layer package with reduced capacitive and inductive coupling and minimized variations in signal transmission line impedance without departing from conventional semiconductor package fabrication processes.

SUMMARY OF THE INVENTION

The present invention provides an improved multi-layer packaging apparatus and method of manufacture which is particularly suitable for high frequency integrated circuit devices that combine high voltage-swing and low voltage-swing signals.

The package of the present invention takes advantage of several novel shielding mechanisms to significantly reduce inductive and capacitive coupling, and to provide controlled impedance for signal transmission lines.

According to one embodiment, the present invention provides a multi-layer package having a plurality of interleaved layers of conductive material and dielectric material surrounding a die-attach area of predetermined size. The package further includes an array of external connectors, spaced at a standard dimension on one side of the package and surrounding the die-attach area; a first plurality of via columns equally spaced at the standard dimension, electrically connecting each external connector to a predetermined path on a selected conductive layer; and a second plurality of via columns each one disposed adjacent to a corresponding one of the first plurality of via columns at a distance less than the standard dimension.

The arrangement of a second via adjacent to a first conductor via is essentially a two-wire line. When the second via in this two-wire arrangement is properly connected at both ends so that a ground loop is formed, the impedance and inductance associated with the conductor via is reduced. Therefore, controlled impedance is made possible in both the horizontal stripline paths (or microstrip) and vertical via paths (i.e. via columns) to help minimize transmission line impedance variations as well as inductive coupling.

In another embodiment, the present invention provides a multi-layer package including a plurality of interleaved layers of conductive material and dielectric material surrounding a die-attach area of predetermined size, and a plurality of via columns electrically connecting selected paths from any one of the plurality of layers of conductive materials to any other. The plurality of layers of conductive materials is connected to carry active electrical signals and shield signals in an alternating fashion, with every conductive layer coupled to carry electrical signals disposed halfway between two conductive layers coupled to carry shield signals.

According to this embodiment, for example, a signal layer is shielded by an upper shield layer connected to the positive power supply and a lower shield layer connected to the negative power supply. This way, the signal lines on the signal layer are immune to any differential power supply noise.

The present invention provides further improvement on the above embodiment by creating the same type of opposite polarity shielding in the horizontal direction. The package of the present invention accomplishes this by connecting conductive paths on the two sides of a signal path on a signal layer, to shield metal of the upper and lower layers through via columns. This way a signal path is surrounded by opposite polarity shielding in vertical as well as horizontal directions.

For integrated circuits that operate with low-voltage-swing signals and require a reference voltage to determine the logic state of each signal, it is crucial to create a noise environment where all signals and the reference voltage are subject to the same noise coupling. The package of the present invention ensures such noise environment by providing floating shield layers that capacitively couple the same reduced noise to all signal lines, horizontally and vertically. Shield layers that float are subject to less external noise as compared to shield layers that connect to a power supply voltage.

In another embodiment, the package of the present invention provides effective isolation of signals in integrated circuits that employ a variety of different signal types in their operation. By dividing the entire package, including each conductive layer, into several electrically isolated zones of different signal and shielding types, cross-talk and other types of noise coupling are reduced to a minimum.

Further features of the present invention, its nature and various advantages will be more apparent from the accompanying drawings and the following detailed description of the preferred embodiments.

DESCRIPTION OF THE PREFERRED EMBODIMENT

Figure 1A:
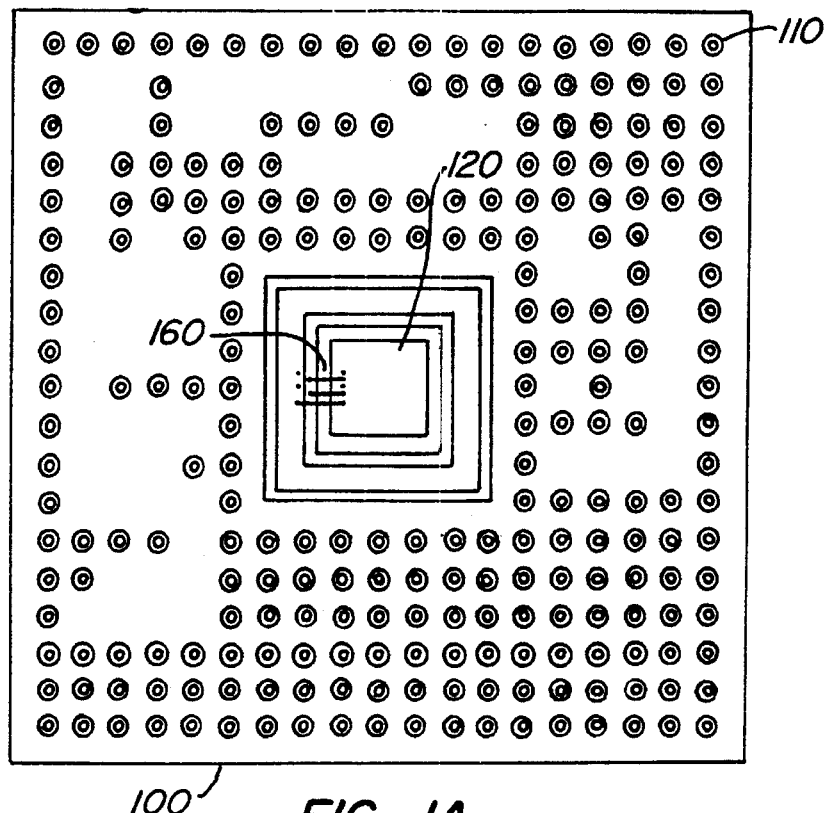
FIGS. 1a, 1b and 1c schematically illustrate the top, side and cross-sectional views of an exemplary multi-layer package.
Figure 1B:
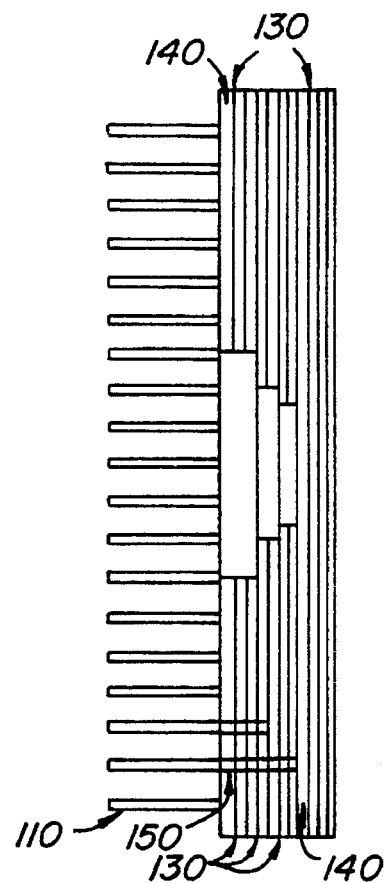
Figure 1C:
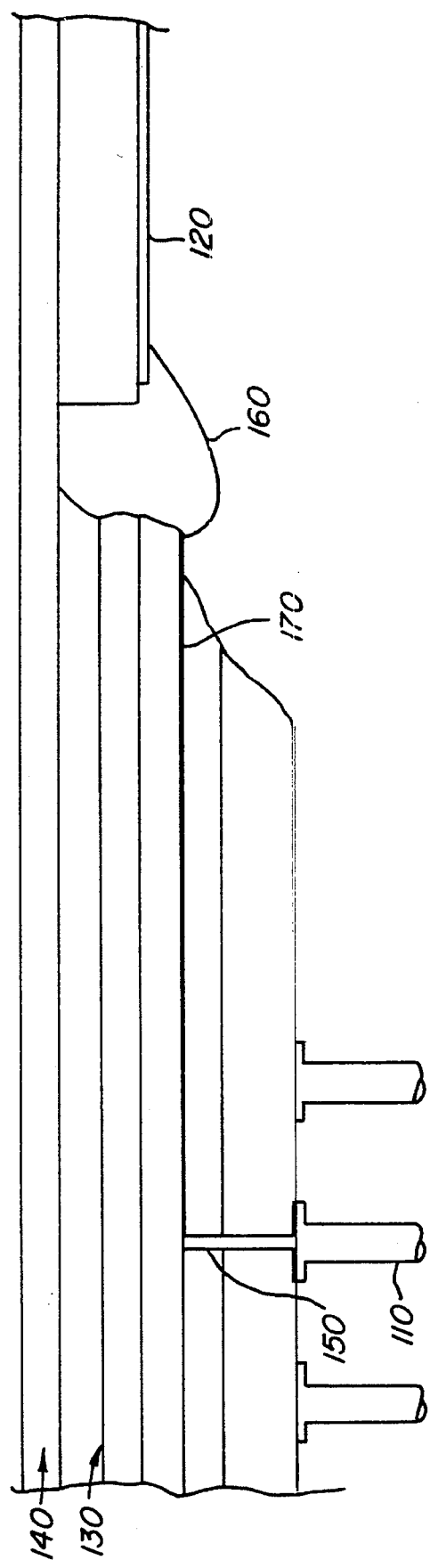

Multi-layer packages provide high pin count and high density capability. An example of a multi-layer package is the pin grid array (PGA) package. FIGS. 1a–1c schematically illustrate the top, side and cross-sectional views of an exemplary PGA package, respectively.

As shown in FIG. 1a, PGA package 100 includes a large number of pins 110 surrounding a rectangular die-attach area where a semiconductor chip or die 120 is mounted. FIG. 1b illustrates a cross section through the center of the multi-layered structure of package 100. Package 100 includes a number of (for example 9) parallel conductive layers 130, insulated from each other by dielectric layers 140 separating conductive layers 130. A plurality of via columns 150 provide for selective interconnection between conductive layers 130, or connections from a conductive layer 130 to a pin 110.

As illustrated in FIG. 1c, an input/output signal on the integrated circuit embedded in the semiconductor chip 120 electrically connects to the outside world through a transmission path that includes four segments: (1) an electrically conductive bond wire 160 connecting a chip 120 bonding pad to a corresponding wire bond post on the package, (2) a horizontal conductive strip 170 connecting the bonding post on the package to a selected via column 150, (3) via column 150 vertically connecting conductive strip 170 to a corresponding (4) pin 110 such that when the package is inserted in a socket on a circuit board, chip 120 can transmit and receive signals from other circuits on the board.

For integrated circuits operating at very high frequencies (e.g. hundreds of megahertz or gigahertz), the electrical properties of each of these transmission path segments become critical. Signal reflection due to variations in transmission impedances, ground bounce due to the inductance associated with the power and ground lines, and cross-talk between various signals due to capacitive coupling are among several of the undesirable effects that cause signal degradation.

Well controlled transmission line impedances are especially critical in circuits in which the rise or fall time of a signal is short compared to the transit time of the signal down its transmission line. Such circuits are especially susceptible to false switching caused by signal reflection. To reduce signal reflection it is necessary to minimize variations in the impedance of a transmission line through the package as much as possible. It is desirable to maintain a uniform impedance of, for example, 50 ohms across the entire transmission path.

While the control over the width of conductive signal strips 170 and the thickness of the dielectric layer 140 provide for some degree of control over the impedance of that segment of the transmission path, no such control normally exits for the impedance of via columns 150 that are typically higher than the desired 50 ohms.

Figure 2:
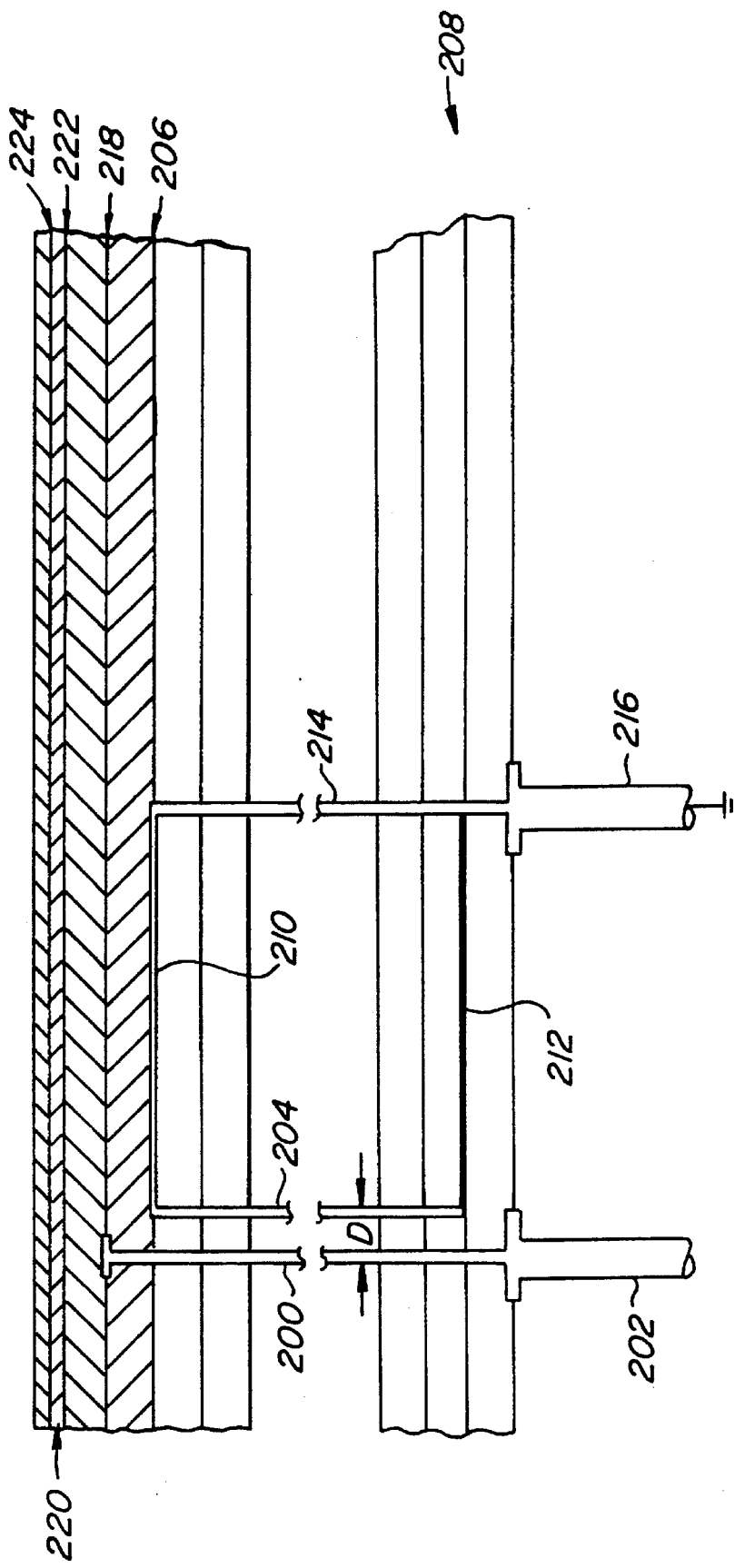
FIG. 2 illustrates a multi-layer packaging technique according to one embodiment of the present invention.

FIG. 2 illustrates a packaging technique according to one embodiment of the present invention, for adjusting the impedance of a via column segment of a transmission path. To lower the impedance of via column 200 attached to pin 202, a shield via column 204 is placed in parallel to via column 200 at a precalculated distance D. Shield via column 204 connects an upper conductive layer 206 to a lower conductive layer 208, and through strip lines (or conductive planes) 210 and 212 connects to a via column 214 attached to pin 216. Pin 216 connects to ground potential.

This arrangement of shield via column 204 in parallel with conductor via column 200 emulates a two-wire transmission line. The characteristic impedance of a two-wire line with wires of diameter d, spaced at a center-to-center distance of D is:

$$Z_0 = K \times ln([D + \sqrt{(D^2 - d^2)}]/d),$$

where K is a constant inversely proportional to the square root of the dielectric constant $\epsilon_r$. The effective impedance of conductor via column 200 can therefore by adjusted by the distance D and/or the via column 200 and 204 diameters. As can be seen from the equation, the effective impedance is reduced as D is made smaller. However, a minimum dimension is set for via center to center spacing for a typical PGA packaging fabrication process. For example, for a PGA package with a 100 mil pin to pin spacing it is possible to drill vias with, for example, 25 mil center spacing without requiring non-standard tooling. To further reduce impedance however, it is possible to add more than one shield via column adjacent to the main conductor via column. The effective impedance of, for example, a three-wire line can be made smaller than the minimum impedance obtainable by a two wire line.

Another advantage of this structure is the reduction in inductance. For conductor vias connected to power supply or ground, a similar structure would result in reduced inductance per unit length. Lower inductance on the ground and power lines reduces undesirable effects such as ground bounce.

The multi-layer package of the present invention employs inductance reduction techniques on the ground and power lines in all segments of the transmission path, from the bond wires to the pins. It is desirable to increase the capacitance on power lines so that they behave as low-impedance voltage sources at high frequencies. This will reduce the amount of high frequency noise coupling to other signals through the power supply. Higher capacitance per unit length translates to lower inductance which is also highly desirable on the power and ground lines to reduce ground bounce.

Techniques to achieve the higher capacitance and lower inductance take advantage of two fundamental principles of physics. First, the velocity of propagation of a wave along a transmission line $V_p$ is equal to the inverse of the square root of the product of the inductance per unit length and capacitance per unit length of the transmission line ($V_p = 1/[\sqrt{(LC)}]$). The velocity of propagation is also given in terms of permittivity $\epsilon_r$ of the medium through which the wave travels: $V_p = c/\sqrt{\epsilon_r}$, where c is the speed of light in free space ($3 \times 10^8$ m/sec.). Therefore, for a transmission line with a given permittivity $\epsilon_r$, the velocity of propagation is constant. As a result, inductance L per unit length and capacitance C per unit length of a transmission line have an inverse relationship. This principle is very helpful in understanding that the desired affect of reduced inductance is an automatic side effect of increased capacitance on power and ground lines.

The second principle is based on mutual inductance between adjacent wires. When a pair of wires is placed close enough together such that their magnetic field lines cross each other, three parameters $L_1$ (inductance of wire 1), $L_2$ (inductance of wire 2) and $L_{12}$ (mutual inductance between wires 1 and 2) characterize the relations between the voltages and fluxes. With current $I_1$ flowing in wire 1 and $I_2$ flowing in wire 2, the voltage induced across wire 1 is equal to the sum $[L_1 (dI_1/dt) + L_{12} (dI_2/dt)]$. If the direction of the currents $I_1$ and $I_2$ are opposite to each other, the voltage generated by the mutual inductance term will partially cancel both the voltage due to wire 1 inherent inductance and the voltage due to wire 2 inherent inductance. In the case of power and ground lines to an integrated circuit, the currents are opposite and to the first degree equal to each other. Therefore, it is desirable to place them as close to each other as possible.

Starting from the first segment (FIG. 1c), the bond wires coupled to ground and power are placed as closely together as possible and with alternating polarities so that their mutual inductances cancel as discussed above.

Next, the performance of power and ground conductive strips across the horizontal layers is optimized. Referring to FIG. 2, assume that the top two conductive layers 222 and 224 are dedicated to power and ground, respectively. To increase power line capacitance, a very thin dielectric layer 220 is used for separating power plane 222 from ground plane 224. In a typical PGA package fabrication process with, for example, 15 mil thick dielectric layers it is possible to use dielectric layers as thin as, for example, 2 mils.

A thinner dielectric layer translates into higher capacitance per unit length and lower inductance per unit length. Therefore, using a very thin dielectric between the power planes allows for placing the power supply pins at a corner of the package, farthest away from the die-attach area where the chip is mounted. Because of the lower inductance per unit length, the increased distance will not result in unacceptably high inductance. This arrangement has the advantage of making available pins closer to the integrated circuit chip for sensitive electrical signals that require minimum propagation delay in their signal path.

Figure 3:
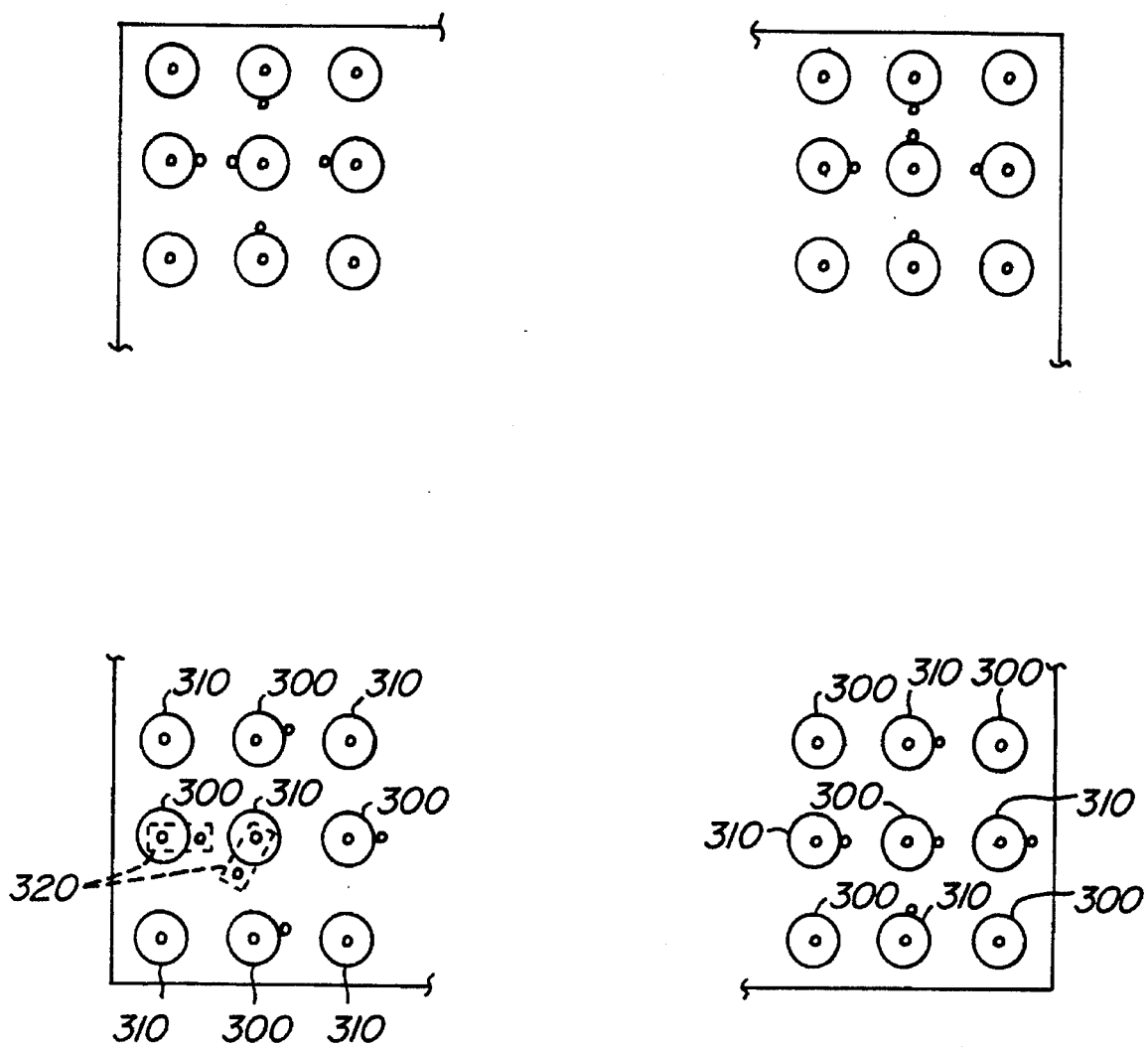
FIG. 3 shows an example of a power supply pin arrangement to obtain reduced inductance.

FIG. 3 shows an example of an arrangement for the power supply pins. These pins are arranged in groups of, for example nine, with alternating polarities in a checkerboard fashion and placed in each of the four corners of the package. Given a, for example, 100 mil center spacing between the pins, as a nine-wire line arrangement, there will be cancellation of mutual inductances between positive power supply (VDD) pins 310 and negative power supply (VSS) pins 300 as discussed above. Since each nine-wire checkerboard arrangement will include one pin of one polarity more than the other (e.g. 5 VSS pins and 4 VDD pins), there will be a slight imbalance in the effective inductances. To compensate for this imbalance, the arrangement is complemented in each of the four corners of the package in an alternating fashion. The reduction in inductance due to this checkerboard arrangement also applies to the corresponding two-wire line vias 320 inside the package.

The above techniques help reduce inductance on power lines and provide for controlled impedance signal lines from the IC bonding pad to the package external pins. The multi-layer packaging of the present invention also provides several techniques aimed primarily at reduction of noise for high frequency operation.

Figure 4A:
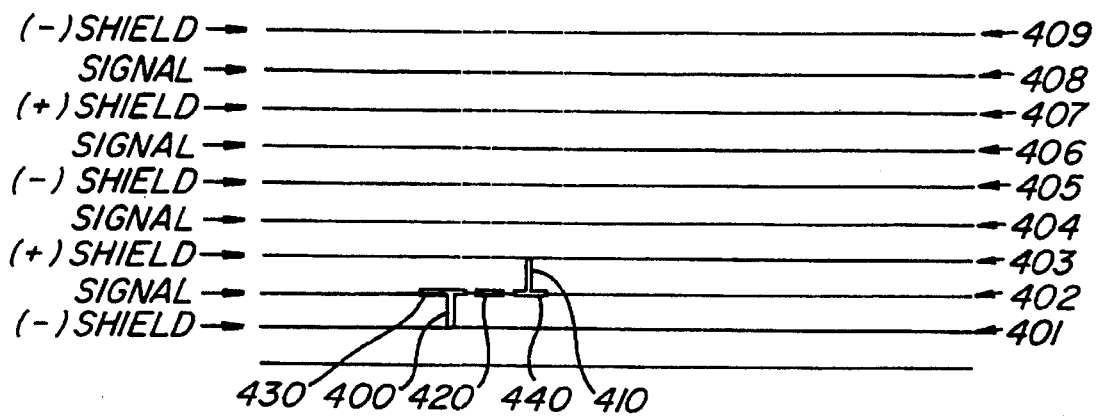
FIG. 4a and 4b show an opposite polarity shielding arrangement in the vertical and horizontal directions, respectively.

To provide immunity against differential power supply noise, opposite polarity shielding is used in both the vertical and horizontal directions. Such shielding is especially effective for circuits operating with high frequency low-voltage-swing signals. FIG. 4a illustrates an example of such opposite polarity shielding for a package with nine conductive layers 401 to 409. Four of the conductive layers are assigned to carry active signals and five are connected to high and low power supplies to shield any one signal layer from another. Opposite polarity shielding in the vertical direction is obtained by interleaving signal and shield layers in an alternating fashion, such that each signal layer is sandwiched between a high power supply shield layer and a low power supply shield layer. Therefore, in FIG. 4a, layers 402, 404, 406 and 408 carry active signals that are sandwiched between shields, layers 401, 405 and 409 connect to the low power supply, and layers 403 and 407 connect to the high power supply.

Figure 4B:
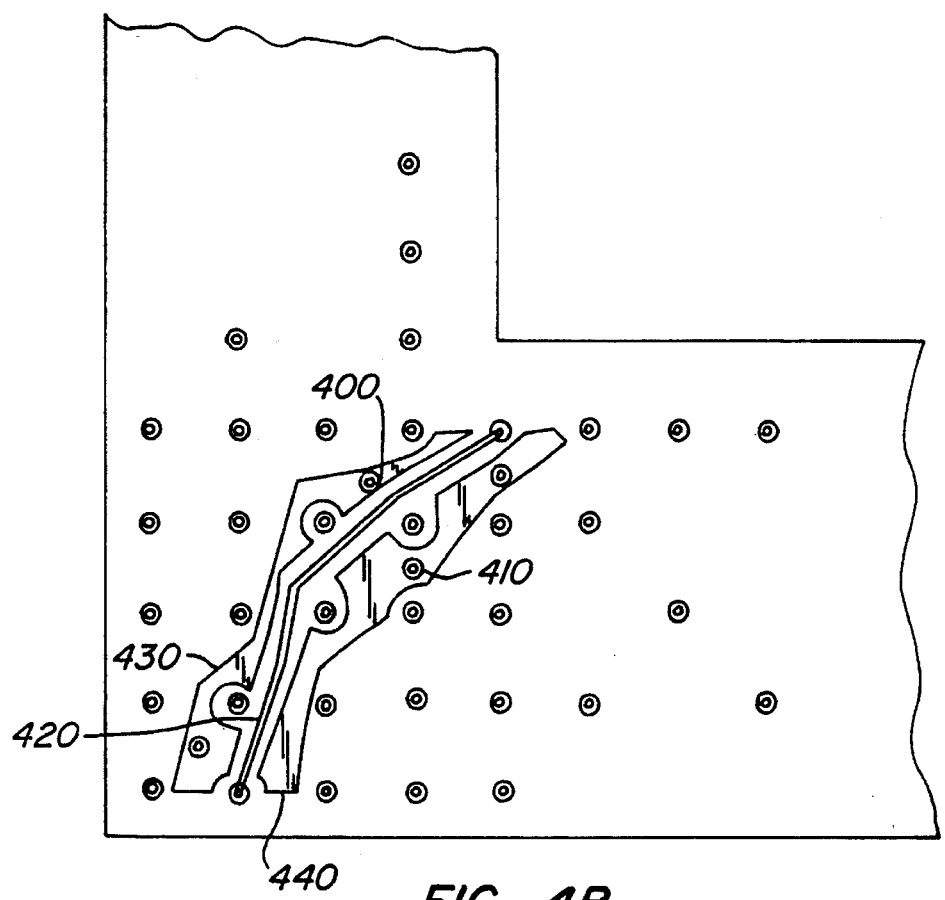

Via columns 400 and 410 allow for opposite polarity shielding in the horizontal direction. As illustrated in FIG. 4b, a conductive strip 420 carrying a critical signal is shielded on both sides by conductive strips 430 and 440 running on either side of strip 420. Via columns 400 and 410 (FIG. 4a) connect shield strips 430 and 440 to the low power supply and the high power supply, respectively. By surrounding a signal line on its opposite sides, as well as above and below, with shield signals of opposite polarity, the signal becomes immune to any differential power supply noise on the high and low power lines. This shielding arrangement also dramatically reduces cross talk between signal lines. The low power supply and high power supply shield layers may also function as power planes, carrying power signals from the pins in the corners of the package to the bond posts in the center of the package.

One type of low-voltage-swing circuit operation requires the signals to travel in pairs of true and complement to enable the circuit to distinguish between a logic high and a logic low. In this type of circuit operation, sometimes referred to as fully differential, the opposite polarity shielding described above is very effective. However, another type of low-voltage-swing circuit operation allows sending only one signal (as opposed to a pair of complements) that is compared to a reference voltage Vref to determine its logic state. In such a circuit, sometimes referred to as quasi differential, one line carrying Vref is normally used as the complementary input for all input signals.

It is critical for the proper operation of circuits with quasi differential, low-voltage-swing signals to maintain the relationship between the signal and Vref. Any single-ended (i.e. non common mode) noise coupled to any one of the signals can easily result in false switching. Noise coupled to the Vref line may result in false reading of all of the signals. Therefore, to optimize the package environment for such quasi differential low-voltage-swing signals, all measures must be taken to ensure that each input signal and the reference input Vref is subject to the minimum and, more importantly, identical noise coupling.

The package of the present invention achieves this by first dividing the signals into groups or bundles, with each bundle sharing its own Vref. The signal lines of a bundle are grouped together with half on each side of the Vref line. At the same time, the pins and the vias are arranged such that the distances the signals in any given bundle must travel from the pins to the die are approximately equal. This arrangement maximizes the similarity of the noise environment each signal in a bundle is exposed to.

To provide further immunity against single-ended noise coupling, shield layers are interleaved between signal layers to provide vertical and horizontal shielding in a similar fashion as illustrated in FIGS. 4a and 4b. However, this time all shield layers are connected to each other and left floating. The floating shield layers allow any noise due to signal switching to be capacitively coupled to all lines adjacent to the shield. That is, since all signal lines and Vref lines are adjacent to a floating shield layer that is connected to all other floating shield layers (vertically as well as horizontally) they are all subject to the same noise coupling and therefore move together. This ensures accurate reading of signal levels when they are compared to the reference voltage by an on-chip differential input buffer. Signal lines having the same lengths ensure equal capacitive coupling between the floating shields and the various signal lines. Shielding in the horizontal direction also helps reduce cross talk between the signals.

Another shielding technique offered by the packaging of the present invention, provides immunity from differential noise on the negative (VSS) and positive (VDD) power supplies. The two top layers in the package are assigned to the power supply lines. However, instead of dedicating, for example, the entire top layer to VDD and the entire layer below that to VSS, the layers are arranged such that equal areas of VDD and VSS conductive material are facing at an equal distance the signal line shield areas parallel to them.

Figure 5A:
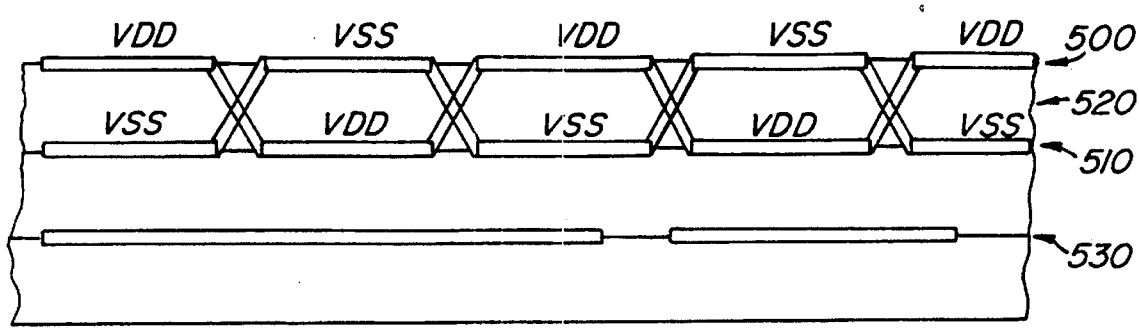
FIGS. 5a and 5b illustrate an arrangement for parallel power supply layers to reduce differential power supply noise.
Figure 5B:
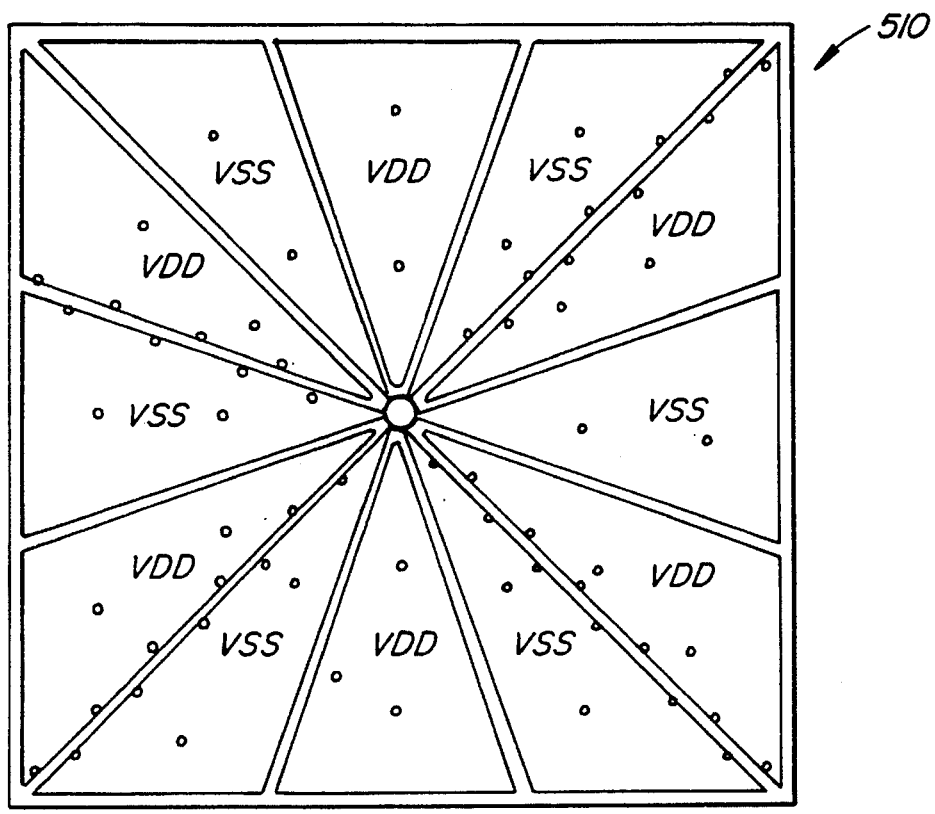

FIGS. 5a and 5b schematically illustrate the underlying principle of this technique. In FIG. 5a via columns (not shown) connecting the two layers 500 and 510 through dielectric layer 520, are employed to create alternating power supply areas on both layers. FIG. 5b shows a top view of layer 510 illustrating equal areas of VDD and VSS. This structure provides the shield zones 530 adjacent to these noisy power supply areas with equal and opposite induced voltage. This effectively makes the shields immune to differential VDD/VSS noise.

As apparent from the preceding description, circuits operating with different types of signals require different shielding mechanisms. However, an integrated circuit may combine several different types of signals on the same chip. The packaging of such integrated circuit chips should therefore, accommodate any combination of or all of the above shielding techniques.

Figure 6:
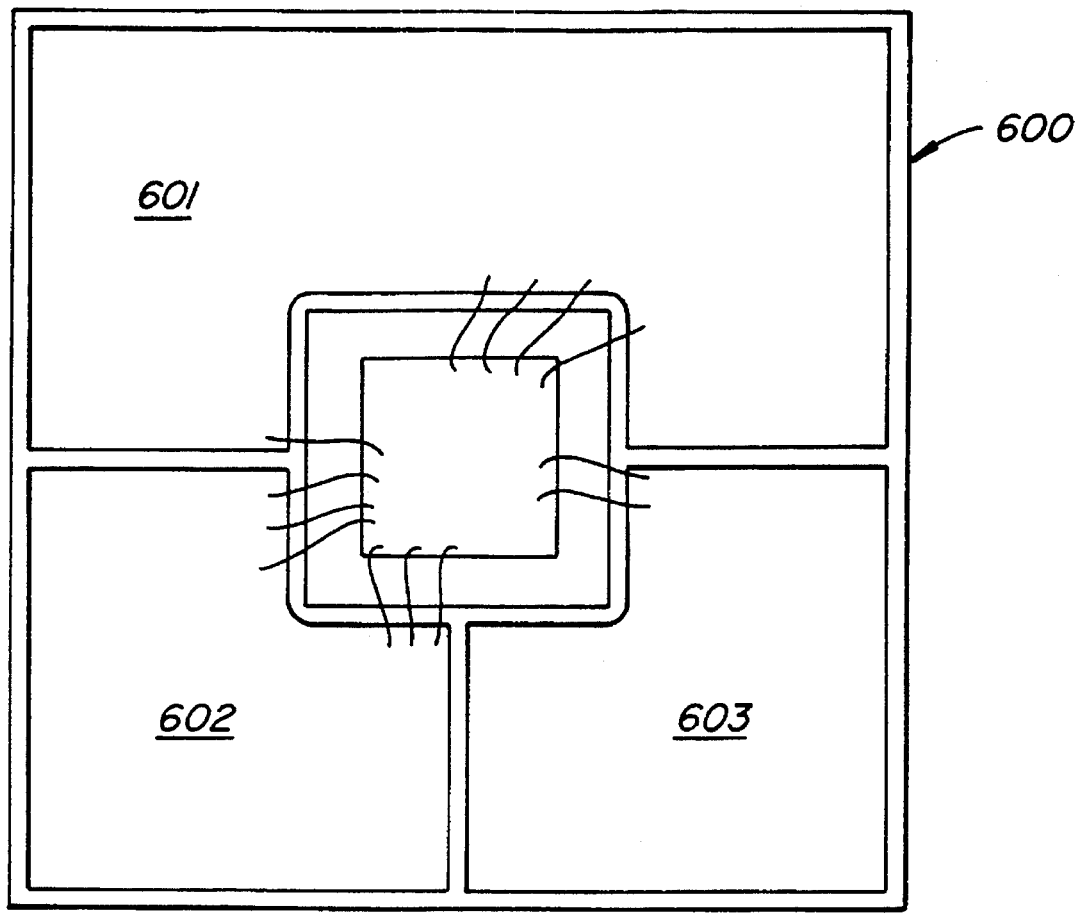
FIG. 6 shows an example of an electrically isolated zoning inside the package.

The package of the present invention provides for effective shielding of various types of signals inside the same package. This is achieved by dividing the package into segregated zones, electrically isolated from each other. Referring back to FIG. 4a, all conductive layers are similarly divided into a number of zones corresponding to the number of different signal types. FIG. 6 shows a top view of an exemplary shield layer 600 divided into three independent zones 601, 602 and 603. Each zone includes a continuous plate of metal to be used as a shield signal. Gaps divide the three zones from each other and allow each shield zone to have its own instantaneous voltage.

Each zone defines the boundaries of the areas dedicated to one type of signal on all of the signal layers interleaved between the shield layers. For example, zones 601, 602 and 603 can be assigned to fully differential low-voltage-swing outputs, quasi differential low-voltage-swing inputs, and CMOS or TTL inputs and outputs, respectively. In that case, opposite polarity shielding as described in connection with FIGS. 4a and 4b using the power supply voltages of the low-voltage-swing outputs, is used on all shield and signal layers in areas corresponding to shield zone 601. In areas corresponding to shield zone 602, floating shielding is used on all shield and signal layers, and opposite polarity shielding using the CMOS power supplies (VDD and VSS) is used in shield zone 603 on all shield and signal layers. This type of zone shielding is very flexible and provides the most effective shielding for a mixed signal package.

In conclusion, the present invention offers a packaging apparatus and method of manufacture which is particularly suitable for high frequency, mixed signal integrated circuit devices. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. In a multi-layer package having a plurality of interleaved layers of conductive material and dielectric material surrounding a die-attach area of predetermined size, and a plurality of via columns electrically connecting selected paths from any one of said plurality of layers of conductive materials to any other, an improved packaging method comprising the steps of:

(a) providing vertical shielding by assigning said plurality of layers of conductive materials to signal layers and shield layers in an alternating fashion, with every signal layer disposed half way between two shield layers; and (b) providing horizontal shielding of a signal path on a signal layer from other signal paths on said layer by placing a first shield path on a first side and a second shield path on a second side of said signal path.

2. A packaging method as recited in claim 1, wherein said shield layers connect to each other and are left floating.

3. A packaging method as recited in claim 1, wherein said two shield layers connect to shield signals of opposite polarity.

4. A packaging method as recited in claim 1, wherein said step of shielding comprises the steps of:

(a) connecting said first shield path to an upper shield layer through a respective one of said plurality of via columns; and (b) connecting said second shield path to a lower shield layer through a respective one of said plurality of via columns.

5. In a multi-layer package having a plurality of interleaved layers of conductive material and dielectric material surrounding a die-attach area of predetermined size, and a plurality of via columns electrically connecting selected paths from any one of said plurality of layers of conductive materials to any other, an improved packaging method comprising the steps of:

(a) assigning said plurality of layers of conductive materials to signal layers and shield layers in an alternating fashion, with every signal layer disposed between two shield layers; and (b) coupling said two shield layers to shield signals of opposite polarity;

(c) shielding a signal path on a signal layer from other signal paths on said layer by placing a first shield path on a first side and a second shield path on a second side of said signal path, said first and second shield paths being coupled to said shield signals of opposite polarity, respectively.

6. In a multi-layer package having a plurality of interleaved layers of conductive material and dielectric material surrounding a die-attach area of predetermined size, and a plurality of via columns electrically coupling selected paths from any one of said plurality of layers of conductive materials to any other, an improved packaging method comprising the steps of:

(a) connecting a plurality of conductive segments on a first layer of conductive material to a first power supply and a second power supply in an alternating fashion and with a first ordering; and (b) connecting a plurality of conductive segments on a second layer of conductive material adjacent to said first layer of conductive material, to said first and second power supply in an alternating fashion and with a second ordering opposite to said first ordering;

whereby a third layer adjacent to either one of said first or second layers faces an area of conductive segments carrying said first power supply substantially equal to an area of conductive segments carrying said second power supply.

* * * * *